United States Patent [19]

Guerra et al.

[11] Patent Number: 5,502,645
[45] Date of Patent: Mar. 26, 1996

[54] BEHAVIORAL SYNTHESIS FOR RECONFIGURABLE DATAPATH STRUCTURES

[75] Inventors: Lisa Guerra, Berkeley, Calif.; Miodrag Potkonjak, Plainsboro, N.J.; Jan Rabaey, Berkeley, Calif.

[73] Assignee: NEC USA, Inc., Princeton, N.J.

[21] Appl. No.: 148,637

[22] Filed: Nov. 5, 1993

[51] Int. Cl.⁶ .................................................. G06F 17/50
[52] U.S. Cl. ........................ 364/489; 364/488; 364/578; 371/22.5
[58] Field of Search .................................. 364/488, 489, 364/490, 491, 578; 371/7, 8.1, 8.2, 9.1, 10.1, 22.1, 22.5, 22.6

[56] References Cited

U.S. PATENT DOCUMENTS

| | | | |
|---|---|---|---|
| 4,922,432 | 5/1990 | Kobayashi et al. | 364/490 |
| 5,036,473 | 7/1991 | Butts et al. | 364/489 |
| 5,133,069 | 7/1992 | Asato et al. | 345/800 |
| 5,274,793 | 12/1993 | Kuroda et al. | 395/500 |

*Primary Examiner*—Kevin J. Teska
*Assistant Examiner*—Susan Wieland
*Attorney, Agent, or Firm*—Philip J. Feig

[57] ABSTRACT

High level synthesis of datapaths has traditionally concentrated on synthesizing a specific implementation for a given computational problem. Methods to compose a reconfigurable BISR (built-in-self-repair) implementation with a minimum amount of area overhead are disclosed. Previously the BISR scope has been restricted to the substitution of operation modules with only those of the same type. Novel resource allocation, assignment and scheduling and transformation methods, primarily for ASIC designs, are described. These methods are based on the exploration of the design solution space accomplished by use of high level synthesis processes to find designs where resources of several different types can be backed up with the same unit.

14 Claims, 2 Drawing Sheets

BEHAVIORAL SYNTHESIS FOR RECONFIGURABLE DATAPATH STRUCTURES

BACKGROUND OF INVENTION

The present invention relates to high level synthesis for datapaths methods for providing Built-In-Self-Repair (BISR) of circuits. Specifically, the BISR synthesis methods eliminate the limitation in the previously employed method of replacing a failed module of one type with a replacement module of the same type. In accordance with the teachings of the present invention, replacement of modules of different types with the same spare units is achieved by using the design space exploration abilities of high level synthesis. One method involves resource allocation, assignment and scheduling. Another method involves transformation (retiming, associativity and the inverse element law).

As the complexity of chip designs increases, fault tolerance techniques such as BISR play an increasingly important role in reliability and yield improvement. BISR is a hybrid redundancy technique where in addition to N core operational modules, a set of spare modules is provided. If a faulty core module is detected, it is replaced with a spare module.

As the cost of semiconductor manufacturing increases, it becomes imperative to improve process yields as fast as possible. Process improvement techniques such as BISR therefore become very important. BISR sparing methodology is a conceptually simple, yet powerful technique for increasing yield by adding redundant modules to the design. If a chip is found to have defective modules, these modules can be replaced by good modules before packaging. Similarly, these same BISR methods can also be applied to improve chip reliability. Chips can be made more fault tolerant to failures that occur during operation, by automatic replacement of failed modules with spare ones, so that the overall system can continue to function correctly. This is especially important in military systems and space exploration missions where it is critical that there are no system failures, even in the face of errors, or where manual replacement of failed modules is either impossible or prohibitively expensive.

BISR techniques are regularly used during the development and operation of primary and secondary memories and sometimes in general purpose bit-sliced execution units. They have not received appropriate attention in ASIC design, but the ever increasing level of integration should make them an important methodology for ASIC yield improvement.

The present invention concerns a novel method of BISR primarily intended for ASIC designs, which can be used for yield improvement or fault-tolerance against permanent faults. The method is broadly based upon the flexibility provided by high level synthesis during design space exploration. The identification and the techniques for exploiting this flexibility are also important aspects of the invention. Intelligent strategies to use the flexibility of solutions is the crucial component for achieving minimum overhead designs of a reconfigurable datapath which can be used not only for a BISR design, but also for design of an Application Specific Programmable Processor (ASPP). Minimum hardware overhead is achieved most often by identifying a set of configurations which are similar in terms of the required hardware resources. Consider, for example, the design of an ASPP to implement the 2 different computations A and B. Let Ai and Bj represent particular implementation solutions for the computations A and B, where (i) and (j) are the total number of possible implementations of A and B respectively. As the ASPP implementation must be able to implement both computations, its hardware is the ration of the hardware, $Ai \cup Bj$, for any i and j. The goal is not to find the $Min(Ai) \cup Min(Bj)$ implementations, but to find the $Min(Ai \cup Bj)$ solution, which in many instances is one for which Ai and Bj have similar hardware implementations. The methods described below have a high potential to facilitate the synthesis of ASPP datapaths due to their ability to produce a great variety of alternative solutions. This increases the likelihood of finding the solution pair (Ai, Bj), for which both Ai and Bj have a small implementation cost and require mainly identical resources.

High level synthesis provides the flexibility of design space exploration so that a variety of design goals can be addressed. Little work has been done on high level synthesis techniques for fault tolerant design. Raghavendra and Lursinsap in an article entitled "Automated Micro-Roll-Back Self Recovery Synthesis" in the 28th ACM/IEEE Design Automation Conference, pp 385 to 390, 1991, concentrated on designs with self-recovery from transient faults using micro roll-back and checkpoint insertion. Karri and Orailoglu in an article entitled "Transformation-Based High-Level Synthesis of Fault-Tolerant ASIC," in the 29th ACM/IEEE Design Automation conference, pp. 662 to 665, 1992 presented a transformation based method for minimizing hardware overhead while achieving a certain level of fault tolerance for common mode failures. Previous high level synthesis methods for enhancing fault tolerance have addressed intermittent and transient faults. See, for instance, D. P. Siewiorek and R. S. Swartz book entitled "Reliable Computer Systems: Design and Evaluation", 2nd ed, Digital Press, Burlington, Mass., 1992. The present invention concentrates on permanent faults, where fault tolerance is used for yield enhancement.

The main object for BISR techniques are systems that are bit-, byte-, or digit- sliced. These systems includes SRAM and DRAM memories, which are made from a set of bit planes and arithmetic-logic units (ALUs), assembled from ALU byte slices. By far the most important use of bit-sliced BISR is in SRAM and DRAM circuits, which is regularly used in almost all present day memory designs. The bit-sliced BISR in memories significantly increases memory production profitability. A simple, yet powerful methodology [or implementation of ALU byte slices was proposed by Levitt et al. in "A Study of the Data Communication Problems in a Self-Repairable Multiprocessor, Conf. Proc. of AFIPS, v 32, pp 515–527, Thompson Book, Washington, DC 1968. Another important technique for preserving data through a failure occurrence in primary storage systems was proposed by Arulpragasm and Swartz in "A Design for Process State Preservation on Storage Unit Failure", 10th Int'l Symp. on Fault-Tolerant Computing, pp 47–52, 1980. The concept is based on the use of a shadow box, a spare memory box which is identical to the other M operating memory boxes. A word stored at address j is the XOR of the words stored at location j in the other M operating boxes and has to be updated after each write to the memory system. In this reliability scheme, the content of a lost box can be reconstructed from the operating boxes and the shadow box by XORing values at corresponding locations. The shadow box technique has been recently extended to secondary memory storage. It is conceptually similar to the Arulpragasm and Swartz technique but makes updates on either a word or page basis.

Massive parallelism is another area where BISR is starting to play a crucial role, which will become increasingly prominent with greater use of concurrent computations. For example, a recently designed 11-Million Transistor neural network execution engine, has a triple-level redundancy structure resulting in the consumption of an additional 2.8 million transistors for BISR. In wafer scale integration, BISR also plays a prominent role. In a highly integrated ULSI system which contains both DRAM and SRAM as well as uncommitted gate- array, statistical studies showed that the BISR technique called interchip relief significantly improves the yield. The role of BISR techniques in systolic arrays designs has been described in the literature, though mostly from a theoretical and statistical point of view. Finally, in space exploration applications, redundancy through standby sparing is used extensively.

BISR methodology is not limited to memory and execution units. For example it has been proposed in the use of a backup fault tolerant clock.

SUMMARY OF THE INVENTION

High level synthesis of datapaths has previously concentrated on synthesizing a specific implementation for a given computational problem. The present invention describes novel methods for designing a reconfigurable BISR implementation design with a minimum amount of area overhead.

BISR is an efficient yield, productivity and reliability fault tolerance improvement technique which will continue to gain importance, particularly with the increasing commercial significance of massively parallel processing. Previously, the BISR scope has been restricted to the substitution of operation modules with modules of the same type. The present invention describes novel resource allocation assignment and scheduling and transformation methods which support a novel heterogenous BISR methodology primarily intended for ASIC designs. These methods are based on the flexibility of the design solution space and the exploration potential of high level synthesis processes to create designs where resources (modules) of different types can be backed up with resources (modules) of the same type.

The BISR implementation design is then used as the basis for fabricating a device, such as an ASIC, in a conventional manner. The present invention provides an improved design including BISR implementation.

A principal object of the present invention is therefore, the provision of a method of high level synthesis of datapaths incorporating BISR where modules of different types can be replaced with modules of the same type.

Another object of the present invention is a method of high level synthesis for reconfigurable datapaths incorporating BISR design through resource allocation, assignment and scheduling considerations.

A further object of the present invention is a method of high level synthesis for reconfigurable datapaths incorporating BISR design through transformations, such as retiming, associativity and the inverse element law.

Further and still other objects of the present invention will become more clearly apparent when the following description is read in conjunction with the accompanying drawings.

DETAILED DESCRIPTION OF THE INVENTION

In order to better understand the BISR method comprising the present invention certain assumptions will be made. First, the algorithm to be implemented is represented as a hierarchical Control- Data Flow Graph G (N, E, C), (or CDFG), with nodes N representing the flow graph operations, and the edges E and C respectively the data and control dependencies between the operations. The control dependencies are used to express relations between operations, which are not imposed by the data precedence relations.

Figure 1:
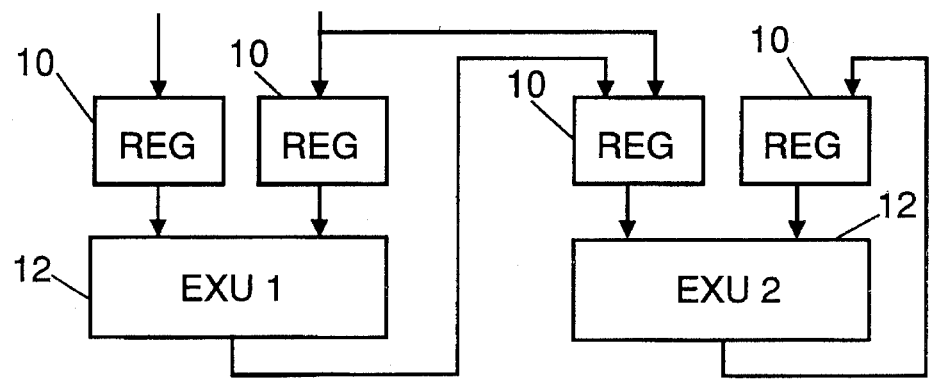
FIG. 1 is a schematic diagram of a hardware model useful for describing the invention.

A hardware model being considered is shown in FIG. 1. In order to stress the importance of interconnect minimization early in the design process, this model clusters all registers in register files 10 connected only to the inputs of the corresponding execution units 12. It is assumed that there is no bus merging, so there exists a dedicated bus connecting any two units between which there are data transfers. Faults can occur in either an execution unit, a register file, or a bus. Using this hardware model and the just mentioned assumption, all faults can be as execution unit faults. A faulty register file prevents its corresponding execution unit from receiving data, and thus has the same affect as a fault in the execution unit. Similarly, a faulty bus can be treated as a failure in the execution unit at its receiving end. All other high level synthesis hardware models can be addressed using the present invention with proper modification of the algorithms, as will be apparent to those skilled in the art.

The high level synthesis BISR process comprising the present invention may be defined within the framework: given a hierarchical flow graph G(N,E,C), an underlying hardware model H and an execution time bound $t_{avail}$, synthesize a minimum area design, so that up to K hardware units can be faulty.

If these methods are used for fault tolerance against permanent faults, it is assumed that an error checking mechanism exists, and if they are used for yield enhancement, it is assumed that manufacturing testing will detect the faulty units. In either case, the hardware is reconfigured upon detection of a fault. The hardware is assumed to be either reprogrammable or to be located on a chip other than the chip containing the datapath.

The most straightforward approach to BISR is to provide a spare hardware module in the design, resulting in full duplication of the hardware. In this case, the number of additional units needed would be W, where W is the number of units required for the non-BISR implementation. Upon detection of a faulty unit, reconfiguration takes place to initiate use of its spare. This reconfiguration is conceptually a switch that passes control from the failed to the backup unit, or a reassignment of operations.

The BISR overhead need not be so high. If the number of faulty units, K, is 1, for example, the high level synthesis assignment step provides the flexibility under which it is clear that only 1 spare unit for each hardware class is necessary, as contrasted with one spare per hardware instance. The operations from the failed unit will be transferred to the spare of the same type. The number of additional units needed in this case is M, where M is the number of hardware classes, and $M \leq W$.

The flexibility gained through assignment clearly reduces the amount of hardware redundancy needed. By taking into consideration the additional flexibility resulting from scheduling, it is possible to use even fewer spares. This is possible since assignment and scheduling enable the 'replacement' of a module by a spare unit of a different type. When a failed unit is detected, instead of reassigning only those operations of the failed unit, there is a complete reassignment and rescheduling of all operations of the CDFG. The specific goal addressed by the can now be restated as follows: find the minimum area solution, for which the algorithm can be reassigned and scheduled in $t_{avail}$, even when as many as K units are faulty.

Figure 2A:
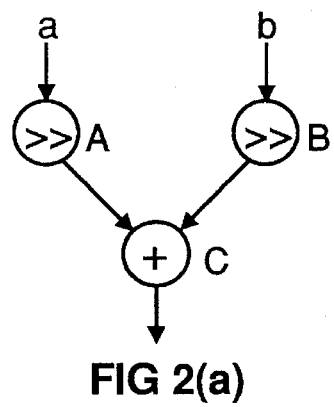
FIG. 2a is a CDFG (control data flow graph) for multiplying the imaginary part of a complex number of a constant value.
Figure 2B:
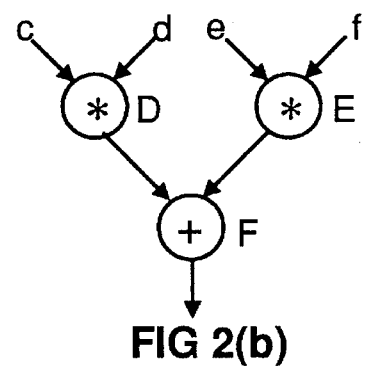
FIG. 2b is a CDFG for multiplying the imaginary part of a complex number of a variable value.

The following example helps to explain the how BISR overhead can be greatly reduced by addressing the use of alternative schedules to alleviate the need for a given failed unit. Consider the example of FIG. 2a and 2b for K=1 which shows the imaginary part of a complex number being multiplied by a constant and with a variable value, respectively. Multiplication by a constant value is such that it can be performed using a single shift. The assumed available time is three control cycles, and each operation takes one control cycle. The minimum hardware required for this computation includes 2 shifters, 1 multiplier and 1 adder. If scheduling flexibility is not exploited, the minimum BISR hardware will be 3 shifters, 2 multipliers and 2 adders. However, if only 2 adders, 2 shifters, and 2 multipliers are allocated it is still possible to achieve a complete BISR implementation by altering the schedule. This is verified by the schedules for all three combinations of failed units shown in Table 1. It is important to note that no additional shifters were needed. In the event of a shifter failure, the scheduling flexibility brought about by the redundant :multiplier is exploited to absorb the need for another shifter.

TABLE 1

| Failed Unit | Adder | | | Shifter | | | Multiplier | | |
|---|---|---|---|---|---|---|---|---|---|
| Control Step | >> | * | + | >> | * | + | >> | * | + |
| 1 | A, B | D, E | | A | D, E | | A, B | D | |
| 2 | | | C | B | | F | | E | C |
| 3 | | | F | | | C | | | F |

In a preferred embodiment of the invention, high level synthesis tools from the HYPER system for allocation, scheduling and assignment is used as the starting point of the BISR algorithm. Such a tool is described in an article by Y. Rabaey et al entitled "Fast Prototyping of Data Path Intensive Architectures" in IEEE Design and Test Magazine, June 1991. The HYPER approach is well suited for use as the basis for the development of new algorithms targeting BISR for several reasons: it decouples allocation, scheduling, and assignment; it provides a mechanism for an interchange of information between them; and most importantly, it performs allocation before the other two tasks. For BISR the primary changes and extensions are made in the allocation mechanism, and thus, a generic assignment and scheduling module can readily be modified for use within this framework.

Before explaining the details of the allocation algorithm which considers many peculiarities dictated by BISR requirements, several definitions are required. An allocation, A, is a proposed set of hardware units for the BISR realization of an application algorithm. For a given K, there are many possible combinations of K units which can fail. Let i represent one such failure event. The child allocation A(i), $A(i) \subset A$ is the effective allocation of hardware (allocation of good units) for the failure event i. Note that the number of elements $|A—A(i)|$ is equal to K. A feasible allocation, A, is thus one for which successful reassignment and scheduling can be accomplished for all of its child allocations A(i).

The basic idea of the allocation mechanism is to start at an initial allocation, add hardware until a feasible allocation is found, then remove all unnecessary redundant hardware. For any proposed allocation solution, it is necessary to assure that scheduling can succeed with any combination of K failed units. The basic framework for the allocation algorithm has been set up and implemented for K=1. The pseudo-code for the global flow is as follows:

```
GetInitialAllocation( );
While TRUE {
    SortInDecreasingOrderOfStress(Ordered_HW);
    for each j ∈ Ordered_HW {
        Success = Assign and Schedule WithFailedUnit(j);
        if (!Success)
            break;
    }
    Update Stress( );
    if (!Success)
        GetNewHWUnit( );
    else
        RedundancyRemoval( );
}
```

The key components of the algorithm are described below.

A sharp minimum bound, $M_j$, on the necessary amount of hardware of each class j is used as the initial allocation. $M_j$ is defined as follows:

$$M_j = m + K$$

where $m_j$=a minimum bound on the amount of hardware j necessary any non fault-tolerant implementation and K=the number of faults.

For each hardware class, j, relaxed based scheduling techniques are used to derive an estimate of $m_j$. The equation for $M_j$ can be understood by observing that any implementation requires at least $m_j$ units, and since up to K units of type j can fail, at least $(m_j+K)$ units are needed.

If the initial allocation fails, the expansion phase is entered, where new hardware units are added one by one until the allocation succeeds. Good selection heuristics have a crucial impact on the speed of the algorithm and the quality of the solution. Firstly, a solution must be reached as quickly as possible, avoiding the addition of unnecessary units along the way. Secondly, a greedy steepest descent type algorithm should be avoided which algorithm could lead to many suboptimal solutions.

Two modes of addition, Stress Based Addition and Last Gasp Addition, are constructed. Stress based addition uses a measure called the global stress of a hardware resource class to decide which hardware type to add next. This measure is composed of several heuristic measures of the difficulty of assignment and scheduling of each hardware class. The larger the stress, the more likely it is that type of unit is the cause for the failure of the assignment and scheduling.

For additional robustness, a Last Gasp Addition Phase is used. This phase is entered if it is found that the stress measure has ceased to give useful feedback. During Last Gap addition, units are added one by one in random order until a feasible allocation is reached. In practice, this phase is rarely entered, but assures a solution will be found if one exists.

At the completion of the expansion phase, there is no guarantee that the feasible allocation is minimal. It is possible that a subset of the allocation A'⊂A is also a solution. To assure that a local minimum has been reached, it is necessary to assure that if any units are removed from the current solution, success cannot be achieved. In general, the units with minimum stress are dried for removal first.

It is also desirable to incorporate a remember-and-look-ahead technique, so that time is not wasted attempting allocations that will definitely fail. The idea of the remember-and-look-ahead technique is to remember all allocations and child allocations that failed, and to use this information whenever considering an allocation A'. Before attempting A', a look-ahead to its child allocations will determine if there is any overlap between the children of A' and any known allocations that have failed. Stated more formally, define F to be the set of failed child allocations. Let G be the set of A' and all children of A'. If G∩F≠ϕ, then A' need not be considered as a possible allocation.

For example, assume that the proposed solution A={3 adders, 2 subtractors, 2 multipliers} failed because a reassignment and scheduling could lot be found for its child allocation A(adder)={2 adders, 2 subtractors, 2 multipliers}. A subtractor was added, and the new allocation A'={3 adders, 3 subtractors, 2 multipliers} was successful. At this point, the removal phase is entered. Initially knowing that A={3 adders, 2 subtractors, 2 multipliers} failed, and that A'={3 adders, 3 subtractors, 2 multipliers} succeeded, it is not clear what will happen with A"={2 adders, 3 subtractors, 2 multipliers}. With remember-and-look-ahead, however, A" can be immediately dismissed from consideration since F={A(adder)}, G= {A", A"(subtractor), A"(adder), A"(multiplier)}, gives G∩F≠ϕ since A"(subtractor)==A(adder).

For a successful allocation, a feasible schedule for each child allocation must be found. The schedules are ordered in decreasing order of difficulty, so that an exit can be made as quickly as possible in the event that there is an insufficient allocation. The ordering is a function of the global stress, so that schedules for the failure of highly stressed units are tried first.

The ordering mechanism as well as several other portions of the allocation algorithm rely heavily on the idea of stress of a hardware unit. Three intuitive or experimentally verified heuristics for the stress function are described.

The first heuristic is Minimum Bounds Stress, M. By experimental observation, operations of type $j$ whose relaxed scheduling minimum hardware bound (R) is close to the absolute minimum hardware bound (X) are difficult to schedule. The absolute minimum bounds are calculated as shown below:

$$<(NumNodes(j) \times duration\ (j))/(AvailableTime)>+K=X$$

The minimum bounds stress for hardware j is:

$$M = 1 - ((R - X)/R) = \frac{X}{R} \qquad (1)$$

The absolute minimum bounds indicates the number of units needed assuming that the flowgraph structure has enough parallelism to achieve 100% hardware utilization. The relaxed scheduling bounds take the graph structure and some data precedences into account resulting in a more accurate bound. Neither of the bounds take into account constraints such as conflicts in writing to register files, and neither fully honors data precedences. The closer these two bounds are, the smaller the hardware slack available to satisfy these constraints, and thus the better the particular unit is as a candidate for addition.

The second heuristic is ϵ-Critical Network Stress, C. If a high percentage of the nodes of a particular hardware resource class j are in the ϵ-critical network, it is likely that this type of operation will be a bottleneck for scheduling, and is thus a good candidate for addition. The ϵ-critical network comprises all paths which have lengths within a small ϵ percentage of the critical path length.

$$C=1-((NumNodes(j)-\epsilon NetNumNodes(j))/(NumNodes(j))) \qquad (2)$$

These two heuristics take into account various elements of the algorithm specification. Both deal with aspects of the overall structure of the flowgraph, and the Minimum Bounds Stress also accounts for the user-specified available time. Since they capture information about the specification and the initial starting allocation, they are most valuable in the beginning of the allocation addition phase. Therefore, their effect is heavily weighted to be greatest in the beginning and to quickly diminish as hardware is added.

The third heuristic is Scheduling Stress, S. Unlike the previous two heuristics, this heuristic changes dynamically with the allocation. It is calculated during the assignment and scheduling. The scheduling difficulty, SD(k), is calculated for each operation, k, and is inversely proportional to the slack time between the As Late As Possible scheduling time and a relaxed As Soon As Possible (ASAP) scheduling time. This value is summed over all nodes of type j:

$$n = \sum_{k \in Nodes(j)} SD(k) \qquad (3)$$

Since the minimum area solution is sought, the stress value is normalized by the hardware cost of the unit, providing the Scheduling Stress for hardware type j as a function of the scheduling difficulty and the hardware cost:

$$S=f(n,Cost(j)). \qquad (4)$$

The global stress is defined as Global Stress(i)=f(M,C,S)=$(M \times C)^{x^{1/\beta}}$ where x is the number of additional units added, and β is an empirical parameter determined through testing to be approximately equal to 3. The Global Stress is a functionally weighted function of the heuristics, and was constructed through the use of testing and statistical validation. As mentioned above, since M and C capture information about the starting allocation, they have a large impact on the Global Stress function in the early stages of the Addition phase. The Scheduling Stress, S, quickly gains dominance as units are added.

In addition to designing BISR by considering resource allocation, assignment and scheduling, it is also possible to design BISR by considering transformation. Transformations are alterations in the computational structure such that the behavior (the relationship between output and input data) is maintained. Transformations arc used extensively in several computer science and CAD areas, most often in compilers and high level synthesis. Transformations have been successfully applied for the optimization of a variety of high level synthesis goals: area, speed, power, and run-time fault tolerance. Transformations using specifically tailored optimization techniques, can significantly reduce the area of implementation for designs with BISR requirements.

Figure 3A:
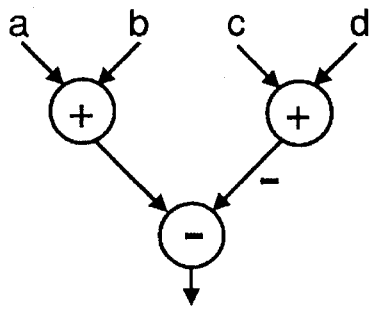
FIGS. 3a and 3b are CDFGs of the same problem as FIGS. 2a and 2b which illustrate transformations for BISR.
Figure 3B:
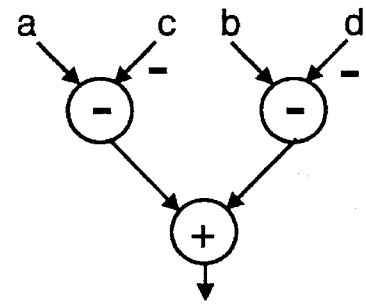

The basic idea behind the application of transformations in high level synthesis based BISR methodology is to transform the computation in several different according to the needs imposed by the available hardware, for each possible scenario of failed units. The simple example in FIG. 3 will be used to illustrate the idea. In all the examples which follow, assume that each operation takes one control cycle, and that transformations are done in such a way that important numerical properties (e.g. numerical stability and overflow control) are maintained in all transformed designs. The validity of the assumptions about the numerical properties of the transformed designs can be verified using the HYPER simulation tools. The assumed available time for the first example is 2 control cycles. The following identity is used to transform the CDFG in FIG. 3a into the CDFG in FIG. 3b:
(a+b)−(c+d)=(a−c)+(b−d).

It is easy to verify that both implementations calculate the same output for the same set of inputs. All operations are on the critical path, so it is not possible to reduce BISR overhead using resource allocation, assignment and scheduling methods described above. In this example, transformations can help to reduce the overhead. If in the implementation shown in FIG. 3a, it is assumed that any unit can fail, then 3 adders and 2 subtractors are needed, since 2 adders and 1 subtractor were needed for the non-BISR implementation. However, if both implementations are considered, only 2 subtractors and 2 adders are needed. If the subtractor fails, implementation in FIG. 3a may be used which requires 2 adders and 1 subtractor, and when the adder fails it is possible to use the implementation in FIG. 3b which requires 2 subtractors and 1 adder.

In general, there exist a large variety of transformations, each of which reduces a computation in different ways. The transformations to reduce BISR overhead, however, can be classified into two classes: (1) Transformations to increase chance for high resource utilization (and therefore reduced need) of the units of the same type as the failed EXU, and (2) Transformations to reduce the number of operations of the same types as the failed resources.

While transformations in the former class is similar to the methodology used during scheduling, transformations in the latter class are specific only to transformations. Some transformations can be used for both classes simultaneously (e.g. inverse element law, distributivity, loop fusion and loop blocking), while others are specific to only one of the classes. The former group, for example, includes retiming (and functional pipelining), associativity, and loop permutation, while the latter group includes strength reduction (i.e. substitution of multiplication with constant by shifts and additions), constant propagation, dead code elimination and common subexpression elimination.

The following description will illustrate how three important and powerful transformations, associativity, inverse clement law, and retiming, can be used for high level synthesis based BISR. It is implied that transformations in the explanatory examples and in the final software application are supported by the commutativity transformation.

Figure 4A:
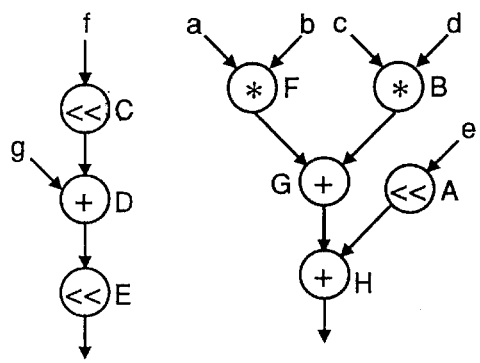
FIG. 4a is a CDFG of a design.
Figure 4B:
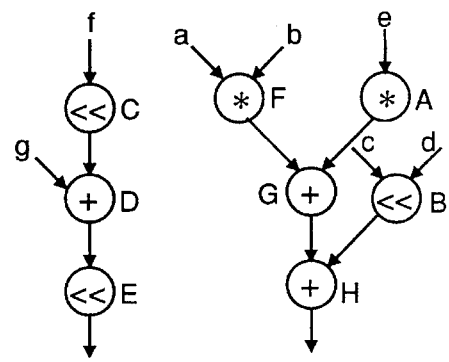
FIG. 4b is a CDFG of the BISR of FIG. 4a design after application of associativity transformation.

FIGS. 4a and 4b show the application of associativity for BISR. For this example, the available time is 3 cycles and assignment and scheduling flexibility does not help to reduce overhead. The only difference between FIG. 4a and FIG. 4b is that associativity is applied so that shift A on FIG. 4a and multiplication B on FIG. 4b are the only operations Milch are not on the critical path. The minimum hardware configuration for the computation of FIG. 4a requires 2 adders, 2 multipliers and 1 shifter. Associativity reduces the minimum BISR overhead, so that only one additional adder and one additional shifter are needed. Table 2 shows the feasible schedules when 3 adders, 2 multipliers and 2 shifters are available for various scenarios of unit failures. When a shifter fails, the implementation from FIG. 4a is used, when a multiplier or adder fail the implementation of FIG. 4b is used. (Either of the implementations in FIGS. 4a or 4b may be used when an adder fails.) Table 2 shows potential schedules for the examples in FIGS. 4a and 4b.

TABLE 2

| Failed Unit Control | Shifter | | | Multiplier | | | Adder | | |
|---|---|---|---|---|---|---|---|---|---|
| Step | >> | * | + | >> | * | + | >> | * | + |
| 1 | C | F, B | | C, A | F | | C, A | F | |
| 2 | A | | D, G | | B | D, G, | | B | D, G |
| 3 | E | | H | E | | H | | | H |

Figure 5A:
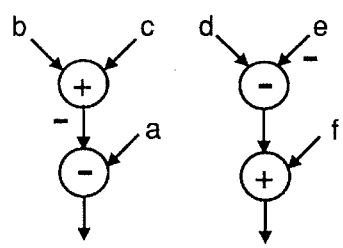
FIG. 5a is a CDFG of a design.
Figure 5B:
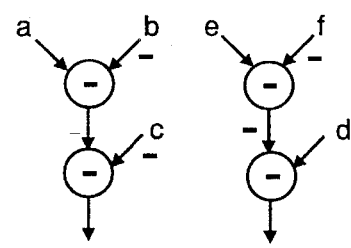
FIG. 5b is a CDFG of the BISR design of FIG. 5a after application of inverse element law transformation.

The inverse element law transformation is used in the example shown in FIGS. 5a and 5b. For an available time of 2 cycles, the non-BISR design can be implemented with 1 adder and 1 subtractor. As in the previous example, scheduling and assignment does not enable a low overhead BISR implementation (of only one additional EXU unit). However, use of the inverse element law (combined with the enabling transformations of distributivity and associativity), results in the following two identities which can be used to transform the implementation of FIG. 5a into which the implementation of FIG. 5b:

$$a-(b+c)=(a-b)-c \quad f+(d-e)=d-(e-f)$$

By using this transformation, only two subtractors and one adder are sufficient to enable the implementation of the required functionality, regardless of which unit is detected as faulty. If one of subtractors fails, the structure of FIG. 5a is used; if an adder fails then the structure of FIG. 5b is used.

Note that it is sometimes possible to totally eliminate the need for a particular type of unit. The computation of FIG. 5, for example, could be implemented for BISR using only three subtractors. This BISR scheme is not preferred however, since a subtractor is slightly more expensive than an adder. Also, this particular application of the inverse element law can similarly be applied to pairs of multiplications and divisions. In such a case, however, it would be significantly more efficient to use the BISR scheme which uses two dividers and one multiplier instead of the solution where three dividers are used.

Using a larger set of transformations (to include algebraic and redundancy manipulations) provides more options for the trading of operations. For example, $x^2-y^2$ can be implement in two ways, either as $(x \times x)-(y \times y)$ or as $(x-y) \times (x+y)$. In this identity one multiplication can be traded for an adder.

Figure 6A:
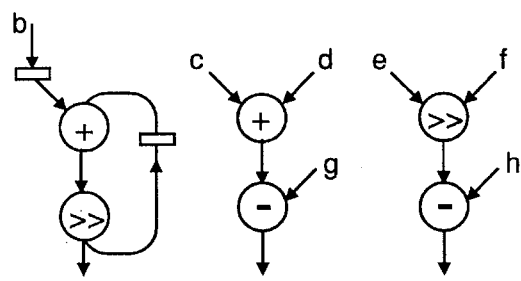
FIG. 6a is a CDFG of a design.
Figure 6B:
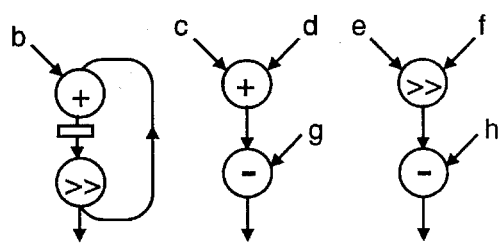
FIG. 6b is a CDFG of the design in FIG. 6a after retiming for BISR.

FIGS. 6a and 6b show how retiming can be used for high level synthesis BISR. The available time in this example is two control cycles. All the operations reside on the critical path, so there is no flexibility during scheduling.

Although retiming cannot, in this case, change the slacks on various operations, it can reshuffle the operation overlaps. This redistribution is done such that operations competing for a faulty unit no longer occur in the same control step. By analyzing the various schedules, for the BISR implementation, 3 subtractors, 2 adders and 2 shifters are sufficient. This results once again in a lower overhead than that achievable using only allocation, assignment and scheduling. The BISR implementation results in the operations which require the faulty units are more uniformly distributed are the available time.

The BISR transformation algorithms, like the allocation, assignment and scheduling algorithms, use HYPER algorithms as a starting point.

As the basis for the BISR transformation-based optimization algorithm, a probabilistic sampling algorithm is used, such as the algorithm described in an article by M. Potkonjak and J. Rabaey entitled "Optimizing Resource Utilization Using Transformations" in IEEE ICCAD-91, pages 88 to 91, 1991. The algorithm applies two types of basic steps: retiming and generalized associativity. Generalized associativity is a transformation that combines associativity steps with inverse element law and commutativity steps. The algorithm has two phases. The first phase is a global search using probabilistic sampling, where the design space is probabilistically evaluated to detect the k most promising starting points (k is a small integer number which is a function of the number of nodes in the computation). In generating the starting points, the number of operations of various types (e.g. subtraction vs. addition) changes using generalized associativity moves (which include the inverse element law) to trade off between the number of those operations.

The second phase, local optimization phase, uses the basic steepest descent approach to locally maximize these starting points. After each step, the objective function is evaluated to obtain an estimate of the final area (execution units, interconnect, and registers) expected from the system. This objective function is composed of three key parts, all of which are strongly correlated to the final area: the critical path, the number of delays, and a measure of the expected resource utilization of each hardware type (the overlap component). During the local phase, the overlap components of the objective function are normalized by the available number of resources of each hardware type. When a unit is in short supply due to failure, the overlap component for the resource is large, and thus the algorithm will transform the graph in such a way that the need for this unit is alleviated.

When this algorithm is used for the optimization of BISR overhead, the proposed allocation is changed, by assuming that various units, one at time, have failed. As was done in the allocation, assignment, and scheduling routine, transformations are tried lot the various scenarios in decreasing order of estimated difficulty. The stress function described above is used to determine the estimated difficulty. Note that transformations must be able to modify the graph so that a successful reassignment and scheduling can be obtained for all child allocations.

Both classes of transformations for BISR are utilized: (1) transformations to increase the chance for high utilization (and therefore reduced need) of the units of the same type as the failed EXU, and (2) transformations to reduce the number of operations of a failed type by trading operations of that type for other operations.

The resulting BISR implementation design, whether based upon resource allocation, scheduling, reassignment or transformation methods forms the basis for fabricating a device, such as an ASIC, in a conventional manner.

The BISR techniques were validated on the set of examples shown in Table 3. The table shows all relevant data for the standard and the BISR synthesis procedures. Note that although the different forms of the 8th order Avenhaus filters provide the same functionality, they have drastically different structures and sizes. The average and median area increases over all examples were 19.1% and 16.6%. Although the initial implementations of all examples had 4 different types of hardware units, an average of only 2.58 additional units were needed for the BISR designs.

TABLE 3

| Example  | IU | FU | NT | IA    | FA    | A %  |
|----------|----|----|----|-------|-------|------|
| Jaumann  | 5  | 8  | 4  | 4.39  | 7.07  | 61.0 |
| 5th WDF  | 6  | 9  | 4  | 1.43  | 1.73  | 21.0 |
| 8IIR DFa | 7  | 10 | 4  | 8.06  | 10.86 | 34.7 |
| 8IIR GMa | 8  | 9  | 4  | 4.84  | 4.95  | 2.3  |
| 7IIR     | 9  | 11 | 4  | 18.18 | 23.76 | 30.7 |
| 8IIR GMb | 9  | 12 | 4  | 6.66  | 6.88  | 3./3 |
| 8IIR P   | 9  | 12 | 4  | 2.23  | 2.55  | 14.4 |
| 8IIR C   | 9  | 12 | 4  | 4.24  | 4.69  | 10.6 |
| 5IIR     | 11 | 14 | 4  | 4.55  | 5.56  | 22.2 |
| 7IIRb    | 17 | 19 | 4  | 4.47  | 4.92  | 3.1  |
| 8IIR DFb | 23 | 26 | 4  | 19.81 | 21.20 | 7.0  |
| wavelet  | 30 | 32 | 4  | 22.05 | 26.19 | 18.8 |

Results on 12 benchmark examples:: IU - # of EXU units in non-BISR implementation; FU - # of EXU units in BISR implementation; NT - # of hardware classes; IA - area of non-BISR implementation; FA - area of BISR implementation; A % - the % increase in area; Jaumann - Jaumann LDI filter; 5th WDF - 5th order elliptical wave digital filter; 8IIR DFa & 8IIR DFb - 8th order bandpass IIR direct form filter for two different set of timing constraints; 7IIRa & 7IIRb - 7th orde r low pass IIR filter for two sets of timing constraints; 8IIR GMa & 8IIR GMb - 8th order bandpass IIR filter Gray Markel form for two sets of timing constraints; 8IIR P & 8IIR C - 8th order IIR filter parallel and cascade form; and wavelet - wavelet quadrature mirror filter.

Table 4 shows physical characteristics of several examples designed using the transformation-based methods of BISR design. The average area increase is only 11.6%, and an average of only 1.33 additional hardware units were needed.

TABLE 4

| Example | IU | FU | NT | IA    | FA    | A %  |
|---------|----|----|----|-------|-------|------|
| 11FIR   | 8  | 9  | 4  | 5.45  | 6.5   | 19.3 |
| 7IIR    | 7  | 9  | 4  | 9.27  | 9.92  | 7.0  |
| 35FIR   | 7  | 8  | 4  | 12.31 | 13.34 | 8.4  |

Physical characteristics of examples used during validation of transformations for BISR: For IU, FU, TU, IA, FA, A % and 7IIR see Table 3; 11 FIR - 11th order high pass FIR filter; 35FIR - 35th order Butterworth Flat Low Pass FIR filter.

While there has been described and illustrated methods of high level synthesis for reconfigurable datapath structures for built-in-self-repair, it will be apparant to those skilled in the art that modifications and variations are possible without deviating from the broad principles and spirit of the present invention which shall be limited solely by the scope of the claims appended hereto.

What is claimed is:

1. A method of synthesizing datapaths for providing built-in-self-repair of hardware circuits comprising the steps of:

defining a circuit to be synthesized as a control data flow graph;

applying at least one of resource allocation, scheduling and reassignment methods to synthesize datapaths for circuit design for minimal area design so that up to a predetermined quantity of hardware units in the design can be faulty with the circuit being operational; and providing a synthesized behavioral level circuit description in accordance with the circuit design for minimal area design.

2. A method of synthesizing datapaths for providing built-in-self-repair hardware circuits as set forth in claim 1 wherein said resource allocation comprises: commencing at an initial allocation, adding hardware units until a feasible allocation is found, and removing unnecessary redundant hardware units.

3. A method of synthesizing datapaths for providing built-in-self-repair of hardware circuits as set forth in claim 2, wherein said adding units comprises at least one of Stress Based Addition and Last Gasp Addition.

4. A method of synthesizing datapaths for providing built-in-self-repair of hardware circuits as set forth in claim 2, wherein said removing units comprises a remember-and-look-ahead method.

5. A method of synthesizing datapaths for providing built-in-self-repair of hardware circuits as set forth in claim 1, wherein said scheduling is performed in order of decreasing difficulty.

6. A method of synthesizing datapaths for providing built-in-self-repair of hardware circuits as set forth in claim 5 wherein said ordering is selected from the group consisting of Minimum Bounds Stress, $\epsilon$-Critical Network Stress, and Scheduling Stress.

7. A built-in-self-repair implementation hardware circuit designed in accordance with the method set forth in claim 1.

8. A built-in-self-repair implementation hardware circuit as set forth in claim 7, wherein said hardware circuit comprises an ASIC.

9. A method of synthesizing datapaths for providing built-in-self-repair of hardware circuits comprising the steps of:

defining a circuit to be synthesized as a control data flow graph, applying a transformation method to synthesize datapaths for circuit design for minimal area design so that up to a predetermined quantity of hardware units can be faulty with the circuit being operational; and providing a synthesized behavioral level circuit description in accordance with the circuit design for minimal area design.

10. A method of synthesizing datapaths for providing built-in-self-repair hardware circuits as set forth in claim 9, wherein said transformation method is selected from the group consisting of inverse element law, distributivity, loop fusion, loop blocking, retiming, functional pipelining, associativity, loop permutation, strength reduction, constant propagation, dead code elimination and common subexpression elimination.

11. A method of synthesizing datapaths for providing built-in-self-repair of hardware circuits as set forth in claim 9, wherein said transformation method is at least one of associativity, inverse element law and retiming.

12. A method of synthesizing datapaths for providing built-in-self-repair of hardware circuits as set forth in claim 9, where said transformation method comprises a global search phase and a local optimization phase.

13. A built-in-self-repair implementation hardware circuit designed in accordance with the method set forth in claim 9.

14. A built-in-self-repair implementation hardware circuit as set forth in claim 13, wherein said hardware circuit comprises an ASIC.

\* \* \* \* \*